(12) United States Patent
Yu et al.

(10) Patent No.: US 9,773,918 B2
(45) Date of Patent: Sep. 26, 2017

(54) METAL OXIDE TFT WITH IMPROVED STABILITY AND MOBILITY

(71) Applicants: Gang Yu, Santa Barbara, CA (US); Chan-Long Shieh, Paradise Valley, AZ (US); Juergen Musolf, Santa Barbara, CA (US); Fatt Foong, Goleta, CA (US); Tian Xiao, Santa Barbara, CA (US)

(72) Inventors: Gang Yu, Santa Barbara, CA (US); Chan-Long Shieh, Paradise Valley, AZ (US); Juergen Musolf, Santa Barbara, CA (US); Fatt Foong, Goleta, CA (US); Tian Xiao, Santa Barbara, CA (US)

(73) Assignee: CBRITE INC., Goleta, CA (US)

( * ) Notice: Subject to any disclaimer, the term of this patent is extended or adjusted under 35 U.S.C. 154(b) by 0 days.

(21) Appl. No.: 14/753,460

(22) Filed: Jun. 29, 2015

(65) Prior Publication Data
US 2015/0303311 A1 Oct. 22, 2015

Related U.S. Application Data

(63) Continuation-in-part of application No. 13/718,183, filed on Dec. 18, 2012, now Pat. No. 9,070,779.

(51) Int. Cl.
*H01L 29/786* (2006.01)
*H01L 21/02* (2006.01)
(Continued)

(52) U.S. Cl.
CPC ...... *H01L 29/7869* (2013.01); *H01L 21/0228* (2013.01); *H01L 21/02266* (2013.01);
(Continued)

(58) Field of Classification Search
CPC .......... H01L 29/7869; H01L 21/02554; H01L 21/02565; H01L 29/66742;
(Continued)

(56) References Cited

U.S. PATENT DOCUMENTS

2006/0233697 A1* 10/2006 Zhou ............... B82Y 30/00
423/610
2010/0248118 A1* 9/2010 Gong ............... G03G 9/0806
430/108.2
(Continued)

OTHER PUBLICATIONS

Aikawa et al., "Effects of dopants in InOx•based amorphous oxide semiconductors for thin-film transistor applications", Oct. 23, 2013, Applied Physics Letters, 103, pp. 172105-1 to 172105-5.*

*Primary Examiner* — Cuong B Nguyen
*Assistant Examiner* — Juanita Rhodes
(74) *Attorney, Agent, or Firm* — Parsons & Goltry; Robert A. Parsons; Michael W. Goltry

(57) ABSTRACT

A thin film circuit includes a thin film transistor with a metal oxide semiconductor channel having a conduction band minimum (CBM) with a first energy level. The transistor further includes a layer of passivation material covering at least a portion of the metal oxide semiconductor channel. The passivation material has a conduction band minimum (CBM) with a second energy level. The second energy level being lower than, equal to, or no more than 0.5 eV above the first energy level. The circuit is used for an electronic device including any one of an AMLCD, AMOLED, AMLED, AMEPD.

38 Claims, 5 Drawing Sheets

(51) Int. Cl.
*H01L 23/31* (2006.01)
*H01L 23/29* (2006.01)
*H01L 29/66* (2006.01)
*H01L 29/423* (2006.01)

(52) U.S. Cl.
CPC .. *H01L 21/02269* (2013.01); *H01L 21/02271* (2013.01); *H01L 21/02282* (2013.01); *H01L 21/02565* (2013.01); *H01L 23/291* (2013.01); *H01L 23/3171* (2013.01); *H01L 29/42356* (2013.01); *H01L 29/66969* (2013.01); *H01L 29/78606* (2013.01); *H01L 29/78648* (2013.01); *H01L 29/78696* (2013.01); *H01L 2924/0002* (2013.01)

(58) Field of Classification Search
CPC ......... H01L 21/02592; H01L 29/78603; H01L 21/268; H01L 21/428; H01L 27/12; H01L 27/1214; H01L 29/45; H01L 29/78693; H01L 27/1225; H01L 27/1288; H01L 29/42384; H01L 29/4908; H01L 29/786; H01L 29/7839; H01L 29/78606; H01L 29/78696; H01L 29/78621
See application file for complete search history.

(56) References Cited

U.S. PATENT DOCUMENTS

| | | | |
|---|---|---|---|
| 2011/0141076 A1* | 6/2011 | Fukuhara | H01L 29/78606 345/205 |
| 2011/0263079 A1* | 10/2011 | Wang | H01L 21/28506 438/149 |
| 2012/0104381 A1* | 5/2012 | Shieh | H01L 29/7869 257/43 |
| 2012/0302003 A1* | 11/2012 | Shieh | H01L 29/66969 438/104 |
| 2014/0332079 A1* | 11/2014 | Chandiran | H01G 9/2018 136/262 |
| 2015/0132100 A1* | 5/2015 | Lin | H01L 21/67248 414/805 |

* cited by examiner

METAL OXIDE TFT WITH IMPROVED STABILITY AND MOBILITY

FIELD OF THE INVENTION

This invention generally relates to metal oxide semiconductor thin film transistors (MOTFTs) and more specifically to improvement of device stability and mobility.

BACKGROUND OF THE INVENTION

The thin film transistor with a layer of metal oxide semiconductor as the active channel layer (MOTFT) has attracted great attention for its high carrier mobility and for its potential for next generation displays and thin-film electronics. However, contemporary issues remaining to be solved include operation stability of the current-voltage characteristics of such transistors in dark and under light illumination. These issues are more profound in devices with related high mobility. Due to the difference between broadband ionic semiconductors and narrow-band covalent semiconductors, the underlying mechanisms of the instabilities in MOTFTs are fundamentally different from those observed in a-Si TFTs.

For a metal oxide TFT under negative bias temperature stress, the metal oxide can go through reduction (i.e. losing oxygen) with the presence of electrons and water leading to a negative shift in threshold voltage ($V_{th}$).

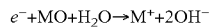

$e^- + MO + H_2O \rightarrow M^+ + 2OH^-$ $M^+$ loss of oxygen $V_{th} \rightarrow$ negative Water decomposition in the presence of strong negative gate bias to the metal oxide channel layer, in turn, provides additional electrons due to the following reaction:

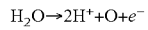

$H_2O \rightarrow 2H^+ + O + e^-$

As the channel is depleted of electrons by the negative gate bias, the above process is accelerated from left to right. Therefore, the channel becomes more conductive and a large negative shift in Vth is observed under negative bias temperature stress (NBTS).

This deleterious effect of water or moisture on negative gate bias stress stability is particularly profound when the TFT is under illumination in which many electrons and holes are generated. One of the strategies to reduce negative bias temperature stress is to limit the presence of water, which at the present time is accomplished chiefly by having a good passivation around the TFT. However, it is difficult and costly to provide a perfect barrier (passivation) to water. Furthermore, any short wavelength light that can be absorbed by the metal oxide semiconductor channel layer has to be blocked in order to reduce the optically induced electrons in the channel layer. In active matrix display applications, it is also difficult to perfectly block light from reaching the channel layer. Some small amount of light will get into the metal oxide layer through scattering and wave guiding. While it may be argued that the amount of moisture entering the TFT and the amount of light impinging on the TFT are small, it must be understood that these effects are occurring over the entire life of the TFT. Therefore, an additional method is desired to reduce the sensitivity of $V_{th}$ shift under negative bias temperature stress with stray light impinging on the metal oxide.

It would be highly advantageous, therefore, to remedy the foregoing and other deficiencies inherent in the prior art.

Accordingly, it is an object of the present invention to provide a new and improved MOTFT with reduced sensitivity to $V_{th}$ shift under negative bias temperature stress (NBTS) with impinging stray light, and at the same time with improved stability under positive bias temperature stress (PBTS) and higher mobility.

It is another object of the present invention to use the new and improved MOTFT for thin film electronic circuits and for electronic devices/apparatus comprising such thin film circuits.

It is another object of the present invention to provide new and improved methods and apparatus for reducing the sensitivity of $V_{th}$ shift under either positive or negative bias temperature stress with or without stray light impinging on a MOTFT.

SUMMARY OF THE INVENTION

The desired objects of the instant invention are achieved in accordance with an embodiment thereof wherein a metal oxide thin film transistor includes a metal oxide semiconductor channel with the metal oxide semiconductor having a conduction band with a first energy level. The transistor further includes a layer of passivation material covering at least a portion of the metal oxide semiconductor channel. The passivation material has a conduction band with a second energy level lower than, equal to, or no more than 0.5 eV above the first energy level.

Briefly, the desired objects of the instant invention are achieved in accordance with a method of fabricating a metal oxide thin film transistor with improved temperature stability and mobility including, not necessarily in the order listed, the steps of providing a substrate and forming a gate with a layer of gate dielectric (also called gate insulator, GI) covering at least a portion of the gate and depositing a metal oxide semiconductor layer on the gate dielectric opposite the gate, the metal oxide semiconductor having a conduction band with a first energy level. The method further includes positioning spaced apart source and drain contacts on the metal oxide semiconductor layer and on opposite sides of the gate. The source and drain contacts define a channel area in the metal oxide semiconductor layer between the spaced apart source and drain contacts and in substantial alignment with the gate. A layer of passivation material is positioned on the metal oxide semiconductor channel area. The passivation material has a conduction band with a second energy level, the second energy level being lower than, equal to, or no more than 0.5 eV above the first energy level.

BRIEF DESCRIPTION OF THE DRAWINGS

The foregoing and further and more specific objects and advantages of the instant invention will become readily apparent to those skilled in the art from the following detailed description of a preferred embodiment thereof taken in conjunction with the drawings, in which.

DETAILED DESCRIPTION OF THE DRAWINGS

Figure 1:
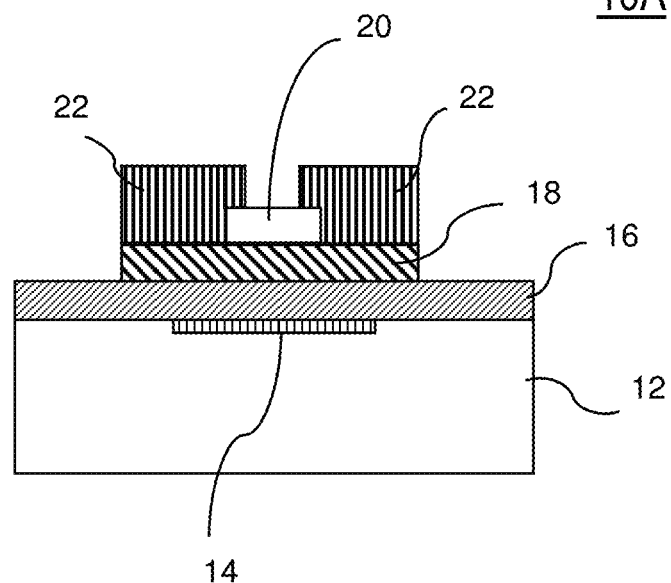
FIG. 1 cross-section view of a bottom gate metal oxide TFT wherein a passivation layer over semiconductor metal oxide channel also serves as etch-stop layer underneath the S/D contacts.

Referring specifically to FIG. 1, a simplified layer diagram of a typical MOTFT 10A with a passivation layer and ohmic channel to source/drain contacts is illustrated. In this specific example, MOTFT 10A is a bottom gate and top source/drain metal oxide TFT. It will be understood that the present invention can apply to any of the numerous MOTFTs and MOTFT 10A is simply shown for illustrative purposes only. MOTFT 10A includes a substrate 12 which is typically made of glass or plastic sheet with a proper passivation coating. The substrate can be either rigid or flexible. For certain applications, an additional passivation layer and/or buffer layer is added on the top surface of substrate 12. For purposes of this disclosure all of the examples (e.g. passivation layer, buffer layer, etc.) will be included in the term "substrate".

MOTFT 10A includes substrate 12 with gate metal 14 deposited and patterned thereon. A gate dielectric layer 16 is deposited over gate metal 14 and a metal oxide semiconductor active layer 18 is deposited and patterned over dielectric layer 16 so as to insulate active layer 18 from gate metal 14. A passivation layer 20 is then deposited and patterned on active layer 18 and source/drain contacts 22 are formed on opposite sides of passivation layer 20 on exposed upper surfaces of active layer 18. The width of the patterned passivation layer 20 defines the channel length for MOTFT 10A.

In addition to serving as a passivation layer in completed MOTFT 10A, patterned layer 20 also serves as an etch-stop during S/D metal patterning process.

Figure 2:
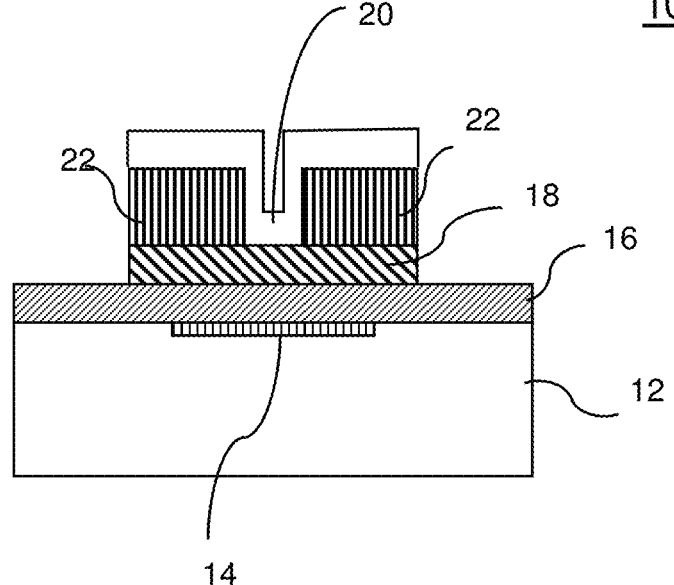
FIG. 2 cross-section view of another variation of a bottom gate metal oxide TFT structure wherein a passivation layer sits on top of both the semiconductor metal oxide channel and the S/D contacts.

Instead of depositing and patterning the passivation layer 20 before the source/drain layer, the passivation layer 20 can also be processed on top of the channel after completing S/D layer. Such process sequence is often referred as back-channel-etching (BCE) structure, and is illustrated in FIG. 2. In this configuration, the space between the source and drain electrodes defines the channel length for MOTFT 10B.

A more complete description of MOTFT 10A or 10B, and methods of fabrication are described in U.S. Pat. No. 7,977,151, entitled "Double Self-Aligned Metal Oxide TFT" and in several additional patents issuing from the original application, such as U.S. Pat. No. 8,129,720. It is believed that any of the various possible MOTFT configurations could be adapted to the disclosed method including for example a bottom gate, bottom source/drain type of device, a top gate, top source/drain type of device, a top gate, bottom source/drain type of device etc. many of which are disclosed and explained in the above cited patents.

It should be understood that substrate 12 of MOTFT 10A or 10B can generally effectively block any water penetration from the substrate side of the device. Also, it is understood that the metal source/drain contacts 22 effectively prevent any moisture from entering the device in those areas. Any water component entering the device comes from the top through any passivation layer or layers, e.g. passivation layer 20, on top of metal oxide channel 18 and between source and drain contacts 22. As explained above, it is extremely difficult and costly to make the passivation completely water tight and, therefore, over the life of the device some moisture will enter.

Figure 3:
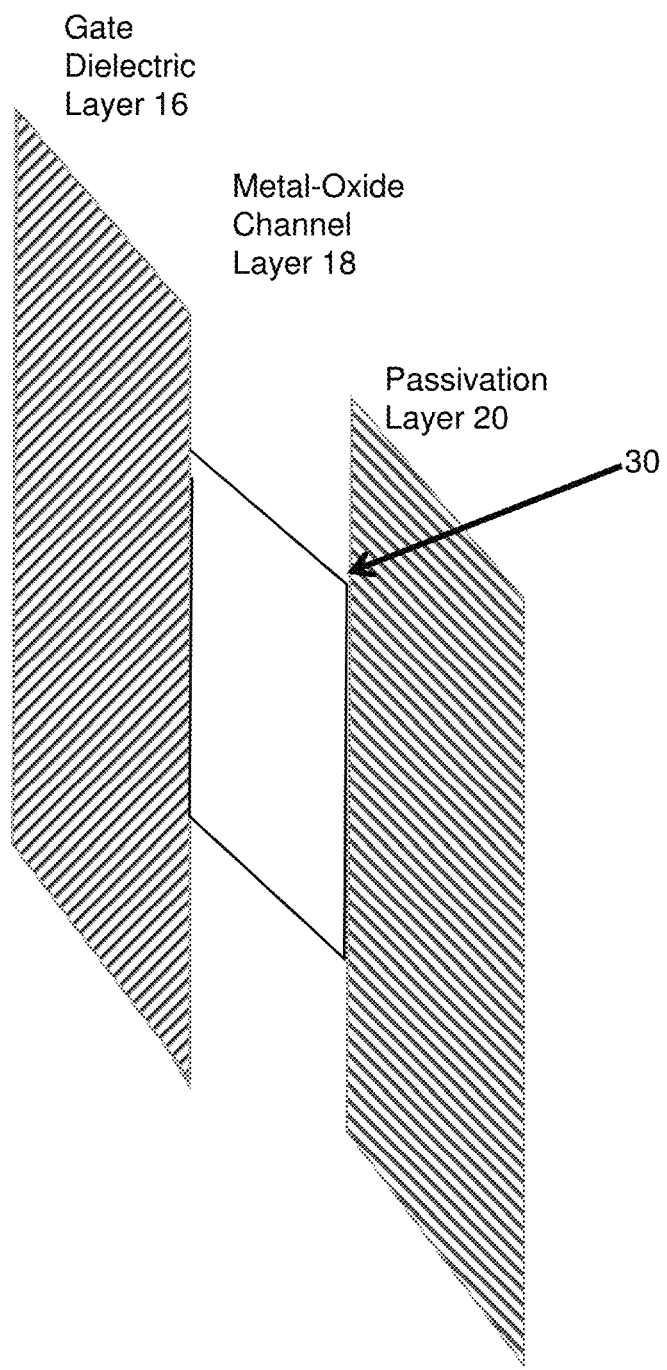
FIG. 3 is a simplified energy band diagram illustrating the MOTFT with conventional passivation under negative bias.

Referring additionally to FIG. 3, a simplified band diagram under negative bias is illustrated for a MOTFT with conventional passivation. As understood from the examples in FIGS. 1 and 2, metal oxide 18 is sandwiched between gate dielectric 16 and passivation material 20. Examples of traditional passivation materials used in MOTFT include $SiO_2$, $Al_2O_3$, SiN, and the like. Thermally or optically generated electrons accumulate at the metal oxide-passivation interface, designated 30 in FIG. 3. The higher the temperature or the stronger the light illumination, the more electrons that are generated to accumulate at interface 30. In a TFT with metal-oxide semiconductor as the channel material, the oxide reduction process occurs most easily at interface 30 where moisture is most abundant and the electron concentration is highest under the negative bias stress. It should be noted that the reduction process is also a positive feedback process. That is, the oxide reduction tends to make the $V_{th}$ more negative which increases the number of electrons available for the reduction process. This positive feedback process makes the $V_{th}$ shift very sensitive to (1) humidity, (2) light illumination, and (3) oxygen vacancies at the oxide-passivation interface.

Figure 4A:
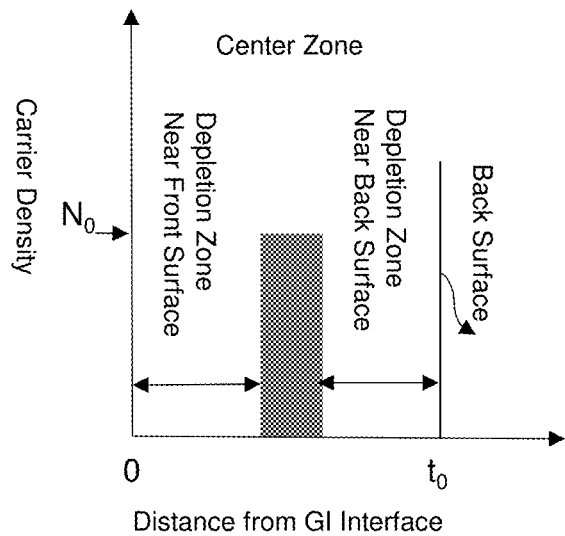
FIG. 4a illustrates the electron carrier density distribution within the channel layer from the gate insulator interface to the back-channel interface in a conventional metal oxide TFT.

Referring now to FIG. 4a, FIG. 4a illustrates the electron carrier density distribution within the channel layer from the gate insulator interface in a conventional metal oxide TFT. The interface of metal oxide semiconductor with either the gate insulator or the passivation layer, both of which are usually formed by PECVD process, usually contains high density of electron traps, causing the electron carriers in the metal oxide semiconductor channel layer to be trapped near both interfaces abutting the gate insulator and the passivation layer. The electron trapping on the interface abutting the gate insulator causes significant depletion of carriers in the front channel which results in a significant positive shift of Vth during operation and reduction of carrier mobility at low Vgs biasing condition. On the other hand, the electrons trapped on the interface abutting the passivation layer may not be stable and could become de-trapped upon thermal or electric field activation.

Figure 4B:
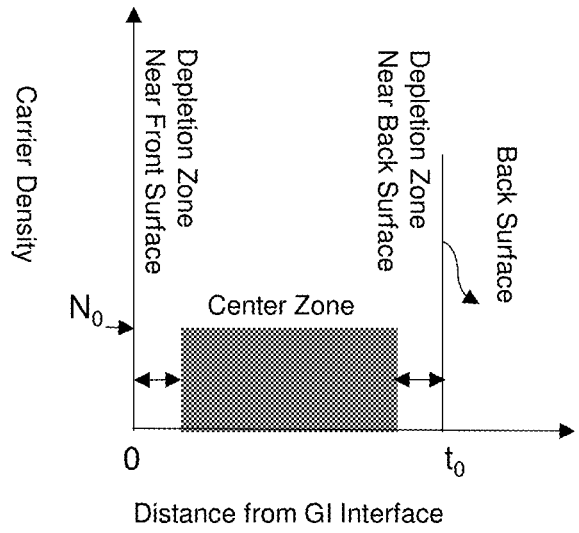
FIG. 4b illustrates the electron carrier density distribution within the channel layer from the gate insulator interface to the back channel interface in a metal oxide TFT with front and back interfacial layers with low trap density.

One way to improve the stability of metal oxide TFT devices has been to insert low trap density layers between metal oxide semiconductor and the gate insulator and between metal oxide semiconductor and the conventional passivation layer, so that electron trapping is minimized at both interfaces and the front and back surface depletion layer thickness is reduced, as illustrated in FIG. 4b. However, this also means that the center channel portion becomes much thicker, necessitating the use of lower carrier density metal oxide semiconductor in order to fully pinch off the TFT device with the same gate insulator capacitance. As has been well known, reducing carrier density in a metal-oxide film with non-perfect crystallinity (unfortunately, in all the cases processed on glass, stainless steel or plastic substrates)

often comes with low carrier mobility. In other words, the improved stability is achieved at the expense of lower mobility as illustrated in FIG. 4b.

A strategy of the present invention is that by careful arrangement of band alignment at the channel-passivation interface, the electrons in the metal oxide channel layer can be transferred to the passivation materials. In addition to the band alignment, the passivation materials are chosen to be less susceptible to the reduction process even with the presence of electrons and moisture. Since the passivation material is not used for switching electric current, there are more options available for material selection. This strategy is particularly effective when the MOTFT is under illumination where many electrons and holes are generated and electrons have to be transferred out of the metal oxide to avoid the reduction process in the presence of water molecules. By properly selecting the passivation material and using the corresponding process (as described in more detail below), one could also donate oxygen into the semiconductor metal-oxide channel in the vicinity of channel-passivation interface. The reduction of oxygen vacancy near interface 30 improves the MOTFT operation stability under reverse bias and under light illumination. Such MOTFT design also enables adopting a metal-oxide channel with higher carrier concentration at gate insulator and channel interface and thus higher carrier mobility (as described in FIG. 6 below).

Figure 5:
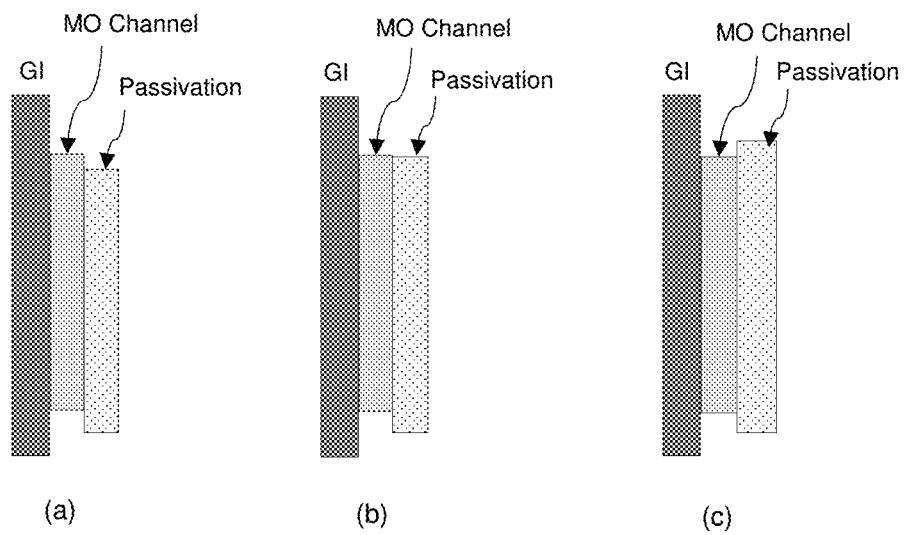
FIG. 5 illustrates the band diagrams showing the relationship between conduction band minimum (CBM) of passivation layer and that of the metal oxide semiconductor.

Turning to FIG. 5, a set of simplified energy band diagrams are illustrated, showing the relationship between conduction band minimum (CBM) of the passivation layer and that of the metal oxide semiconductor in accordance with the present invention. In contrast to the conventional passivation materials made with PECVD with large energy gap between CBM levels of the channel and the passivation materials, in this invention, an optimized passivation layer is chosen such that the CBM of the passivation material is close to the CBM of the metal oxide semiconductor. For the purpose of this disclosure, "close" is defined as the CBM of passivation material being lower than, equal to, or no more than 0.5 eV above the CBM of the metal oxide semiconductor channel.

Choosing a passivation material with a conduction band close to the conduction band of the metal oxide semiconductor material facilitates the transfer of electrons from the semiconducting metal oxide to the passivation material, especially under the negative gate bias field. By spreading electrons into the electron transferring passivation layer, there are fewer electrons for oxide reduction in the channel layer of the metal oxide semiconductor and, thus, the bias temperature stress stability is improved and the MOTFT is less susceptible to the reduction process through moisture even with the presence of electrons.

Examples of passivation materials that can be used with typical semiconductor metal oxides include $Ta_2O_5$, $TiO_2$, $V_2O_5$, $Nb_2O_5$, $W_2O_3$, $ZrO_2$, $HfO_2$, $SC_2O_3$, $Y_2O_3$, $La_2O_3$, $Ga_2O_3$, $MgO$, $SnO_2$, $SnO$, $Zn_2SnO_4$, $AlCuO_2$, $SrCu_2O_2$, $SrTiO_3$, $BaTiO_3$, $MnTiO_3$, $WO_3$, $MoO_3$, $Mo_2O_3$, $PbO$, $Bi_2O_3$, $(B_2O_3)_x(Al_2O_3)_y(In_2O_3)_z$, or their combinations in stack or in composite forms. The passivation layer can also be made in blend oxide form comprising at least one of the metal oxides listed above and a fraction of insulating compounds. These materials can be deposited by one of vacuum deposition methods including physical deposition such as thermal deposition or sputter deposition, CVD, atomic layer deposition (ALD). The passivation layer can also be formed from a precursor solution by a coating process method such as spray pyrolysis, screen printing, spin-coating, slit/slot coating, transfer printing with a following annealing process at an elevated temperature. Typical annealing temperature is in a range of 150° C. to 450° C. When patterning is needed (such as in the case shown in FIG. 1), this layer can be patterned by one of the lithography processes known to experts in the field. In one of special cases, the blend oxide passivation film can be made in a pre-cursor form which is photopatternable directly and then converted into the final form described above.

To retain the current switching ratio that is presently available in typical MOTFTs under high bias conditions, the passivation material needs to be substantially more insulating than the channel layer. That is the passivation material preferably is chosen to be substantially more insulating or less conductive than the semiconductor metal oxide channel with conductivity preferably less than $10^{-1}$ S/cm. Not only should the passivation layer be much less conductive than the channel layer but the ratio of the channel layer conduction to the conduction of the passivation layer should remain relatively constant. Further, the insulating value of the passivation material should be retained and the charge neutrality of the passivation material should be maintained after electron transfer from the metal oxide channel layer. This could be achieved, for example, by selecting a proper metal-oxide passivation material (see examples above) in which the metal includes a variable valence and the passivation material retains a desired electrical insulation at different oxidation/reduction stages. One specific example is tantalum-oxide in which the insulating $Ta_2O_5$ can be reduced into insulating $TaO_2$ and $Ta_2O_3$ after accepting electrons from the metal-oxide channel layer. In this case, the passivation material $Ta_2O_5$ effectively serves a good electron acceptor. In general, passivation materials with a tendency to accept electrons or form acceptor-like states could be considered as good candidates. Such materials tend not to form oxygen vacancies in the passivation layer, and instead have a tendency to accept the electron carriers from the metal oxide semiconductor without causing charge trapping, enabling the high carrier density metal oxide semiconductor to be effectively pinched off through carrier depletion at the back channel. Therefore, high mobility TFT devices can be made with high carrier density metal oxide semiconductor without the need to reduce the channel thickness which could complicate uniformity control. Further, the ability of the passivation materials to maintain charge neutrality after accepting electron carriers helps ensure stable operation of the devices even with the presence of moisture and temperature changes.

In addition, a low trap density layer can optionally be used at the gate insulator-channel interface. U.S. patent application Ser. No. 12/915,712 (4674-A20) disclosed a method of forming a high mobility and stability MOTFT by inserting a thin, low trap metal oxide layer at the channel-GI interface.

It is worth pointing out that the passivation materials disclosed in this invention can also donate oxygen into the channel layer during deposition or a post annealing process in an ambient environment comprising oxygen. When such process is taken during TFT fabrication, one could reduce the oxygen vacancy in the metal-oxide channel layer near the channel-passivation interface. Such mechanism also enables one to select a metal-oxide channel with higher carrier concentration near the interface with the gate insulator. Such arrangement enables a MOTFT with improved carrier mobility and operation stability.

Figure 6:
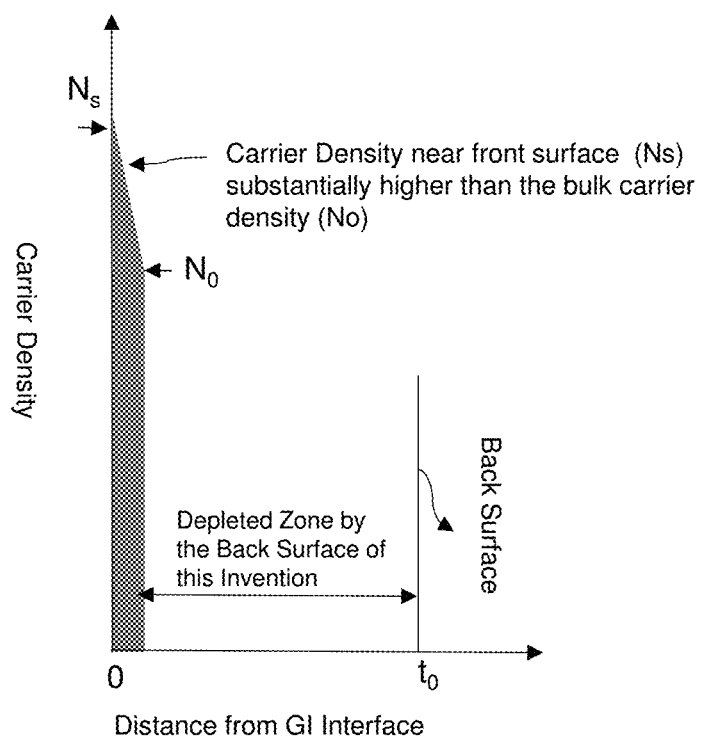
FIG. 6 illustrates the electron carrier density distribution with increasing vertical distance from the gate insulator interface in the metal oxide TFT of current invention.

FIG. 6 illustrates the electron carrier density distribution along the thickness direction from the gate insulator interface. Due to the transfer of electrons from metal oxide semiconductor to passivation layer, a substantial thickness of the back channel of the metal oxide semiconductor becomes depleted of electrons when the gate is positively biased, and therefore a very high concentration of electron carriers can be accumulated within a thin layer of the front channel (near the GI interface) and yet the device can still be effectively switched off under zero bias. This results in a very high mobility for the TFT device.

In addition to selecting a passivation material with an energy level alignment close to that of the metal oxide semiconductor channel layer, it is preferable that the passivation material has an optical gap larger than the optical gap of the metal oxide semiconductor channel layer.

It should be understood that the MOTFT structures disclosed in this invention can be achieved with tools available in existing TFT manufacture lines originally set up for a-Si TFT. Also, for a specific case shown in FIG. 1, the channel layer (18) and the etch-stop layer (20) can be formed over the gate and gate insulator by sputter process without breaking vacuum between 18 and 20. This can be done by loading the substrate with gate and gate insulator layers into a sputter tool with multiple sputter chambers (sometimes called cluster type) or a chain type (also called in-line type) sputter tool with multiple target positions. The channel layer 18 and the etch-stop layer 20 can be processed in different sputter chambers or at different target positions in the same chamber without vacuum break. Such process arrangement does not only simplify the manufacturing process and improve process yield, but also enables a clean channel/etch-stop interface with the least contamination. The patterns of the channel layer and the overlying etch-stop layer (see FIG. 1) can be achieved after the deposition with photolithography steps with two masks, or with a single mask with half-tone, or gray-tone structures.

In the case of cluster tools with multiple vacuum chambers, the process can go beyond the sputter step (DC, pulsed-DC, AC or RF). Atomic layer deposition (ALD), CVD, or reactive thermal deposition can be used for etch-stop layer 20 and even for channel layer 18.

The present invention provides a new and improved MOTFT with stable Vth under negative bias temperature stress (NBTS) with impinging stray light, and at the same time with improved stability under positive bias temperature stress (PBTS) and higher mobility.

Figure 7:
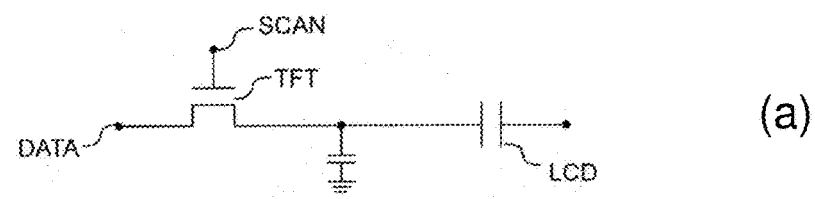
FIG. 7 shows pixel driver/readout circuits for (a) AMLCD, (b) AMOLED/AMLED, (c) passive pixel sensing imager and (d) active pixel sensing imager, (c) and (d) can also be used for current/charge sensing when replacing the photodiode with a corresponding sensor cell.
Figure 7:
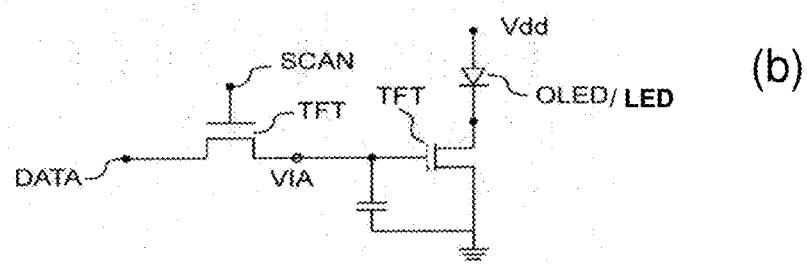
Figure 7:
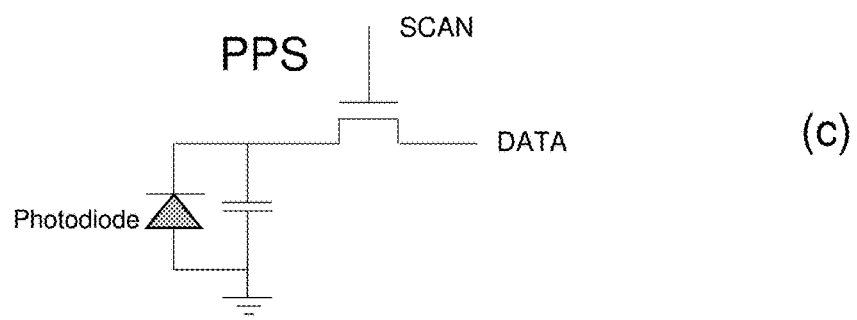
Figure 7:
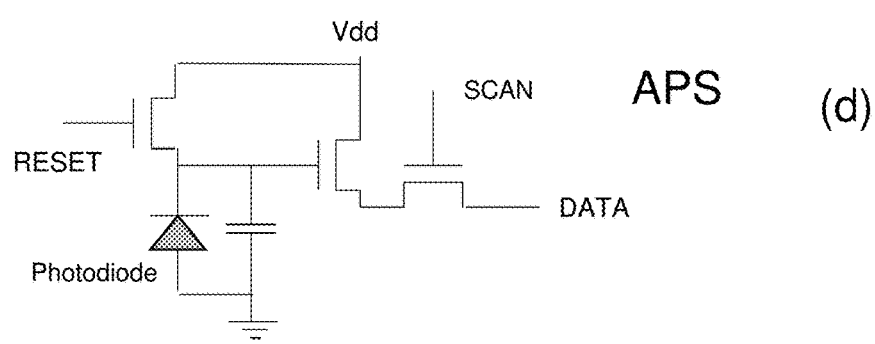

Such high mobility and stability MOTFTs can be used for constructing a variety of thin film circuits and electronic devices. Several examples of forming pixel driving or read-out circuits in LCD, OLED, LED displays, image arrays, chemical/bio-sensor arrays are shown in FIG. 7. When replacing the LCD cell with an electrophoretic display (EPD) element, an AMEPD display can be constructed. When the LCD cell in FIG. 7a is replaced with an electrode pad, a pixel of touch/proximity/gesture sensor array can be constructed.

The capacitors in FIG. 7 can be achieved with the source/drain metal and gate metal sandwiching with either gate insulator, or etch-stop layer, or both in between. These multiple choices provide great flexibility to circuit design. In addition to pixel driver/readout, the high mobility and stability MOTFT disclosed in this invention can also be used for constructing the driving circuits in proximity areas outside the array. Examples of such circuits include (but are not limited to) shift register, clock, level shifter, multiplexer/de-multiplexer and so on.

In certain applications, additional inorganic and/or organic dielectric layers, conductive layers can be added over the MOTFT shown in FIGS. 1 and 2. For example, in fringe-field-switching (FFS) or in-plane-switching (IPS), LCD back-panel circuits, one needs to construct two transparent electrodes with a dielectric layer sandwiched in between for the LCD pixel elements. These layers could be constructed over the MOTFT sketched in FIGS. 1 and 2. In such applications, the additional conductive layer can be designed over the MOTFT channel area (see FIGS. 1 and 2) as another gate electrode. In such a design, a MOTFT with double gates is achieved. Such double gate MOTFTs can sometimes provide additional control/compensation/sensing functions and improves functionality over each pixel area. Such MOTFT can be used for constructing chemical sensor arrays or biosensor arrays in which the top gate can be used for each test cell of the array. In such double-gate MOTFT, the top gate insulator layer can be formed with the passivation layer disclosed in this invention and/or with the additional dielectric layer after the MOTFT processes.

When the energy gap of the metal-oxide channel layer is chosen larger than 3.1 eV (<400 nm), the MO channel layer and the bottom electrodes in the pixel array for FFS/IPS-LCDs can be formed with the same metal-oxide layer. An example is disclosed in U.S. Pat. No. 8,187,929.

Various changes and modifications to the embodiment herein chosen for purposes of illustration will readily occur to those skilled in the art. To the extent that such modifications and variations do not depart from the spirit of the invention, they are intended to be included within the scope thereof which is assessed only by a fair interpretation of the following claims.

Having fully described the invention in such clear and concise terms as to enable those skilled in the art to understand and practice the same, the invention claimed is:

1. An active matrix display thin film circuit comprising a plurality of metal oxide thin film transistors, each metal oxide thin film transistor of the plurality of metal oxide thin film transistors consisting of:
   an interface between a metal oxide semiconductor channel and a layer of passivation material designed to maintain a substantially constant threshold voltage in the presence of optically induced electrons in the metal oxide semiconductor channel, the interface between the metal oxide semiconductor channel and the layer of passivation material including:
   the metal oxide semiconductor channel having a conduction band minimum (CBM) with a first energy level; and
   the layer of passivation material covering at least a portion of the metal oxide semiconductor channel to define the interface therebetween, the layer of passivation material blocking short wavelength light that can be absorbed by the metal oxide semiconductor channel, and the layer of passivation material having a conduction band minimum (CBM) with a second energy level, the second energy level being lower than, equal to, or no more than 0.5 eV above the first energy level, whereby electrons in the metal oxide semiconductor channel adjacent the interface are free to transfer into the layer of passivation material, and the layer of passivation material having an insulating value that is retained and a charge neutrality that is maintained after electron transfer from the metal oxide channel layer.

2. The active matrix display thin film circuit as claimed in claim 1, wherein the layer of passivation material includes one of $Ta_2O_5$, $TiO_2$, $V_2O_5$, $Nb_2O_5$, $W_2O_5$, $ZrO_2$, $HfO_2$, $SC_2O_3$, $Y_2O_3$, $La_2O_3$, $Ga_2O_3$, $MgO$, $SnO_2$, $SnO$, $Zn_2SnO_4$, $AlCuO_2$, $SrCu_2O_2$, $SrTiO_3$, $BaTiO_3$, $MnTiO_3$, $WO_3$, $MoO_3$, $Mo_2O_3$, PbO, $Bi_2O_3$, $(B_2O_3)_x(Al_2O_3)_y(In_2O_3)_z$ or combinations thereof in stack or in composite forms.

3. The active matrix display thin film circuit as claimed in claim 1, wherein the layer of passivation material is substantially more insulating or less conductive than the metal oxide semiconductor channel and preferably has a conductivity less than $10^{-10}$ S/cm.

4. The active matrix display thin film circuit as claimed in claim 3, wherein more acceptor-like states are formed in the layer of passivation material than in the metal oxide semiconductor channel.

5. The active matrix display thin film circuit as claimed in claim 3, wherein each metal oxide thin film transistor of the plurality of metal oxide thin film transistors further consists of a gate insulator; wherein more acceptor-like states are formed in the layer of passivation material than in the gate insulator.

6. The active matrix display thin film circuit as claimed in claim 5, wherein electron carriers in the metal oxide semiconductor channel are highly concentrated near an interface with the gate insulator.

7. The active matrix display thin film circuit of claim 1, wherein the active matrix display thin film circuit is used for an electronic device receiving or generating light.

8. The active matrix display thin film circuit as claimed in claim 7, wherein the electronic device is one of a display device, image array device, bio-sensor device, touch/proximity/gesture sensor device, chemical sensor device or combinations thereof.

9. The active matrix display thin film circuit as claimed in claim 8, wherein the electronic device is one of an active matrix liquid crystal display (AMLCD), an active matrix organic light emitting diode (AMOLED), an active matrix light emitting diode (AMLED), and an active matrix electrophoretic display (AMEPD).

10. An active matrix display thin film circuit comprising a plurality of metal oxide thin film transistors, each metal oxide thin film transistor of the plurality of metal oxide thin film transistors consisting of:
a substrate;
a gate supported by the substrate;
a layer of gate dielectric covering at least a portion of the gate;
a metal oxide semiconductor channel positioned on the layer of gate dielectric in overlying relationship to the gate, the metal oxide semiconductor channel having a conduction band minimum (CBM) with a first energy level;
metal source/drain contacts positioned on the metal oxide semiconductor channel on opposite sides of the gate; and
a layer of passivation material covering at least a portion of the metal oxide semiconductor channel between the metal source/drain contacts to define an interface between the layer of passivation material and the metal oxide semiconductor channel, the layer of passivation material blocking short wavelength light that can be absorbed by the metal oxide semiconductor channel, and, the layer of passivation material having a conduction band minimum (CBM) with a second energy level, the second energy level being lower than, equal to, or no more than 0.5 eV above the first energy level whereby electrons in the metal oxide semiconductor channel adjacent the interface are free to transfer into the layer of passivation material, the interface being designed to maintain a substantially constant threshold voltage in the presence of optically induced electrons in the metal oxide semiconductor channel, and the layer of passivation material having an insulating value that is retained and a charge neutrality that is maintained after electron transfer from the metal oxide channel layer.

11. The active matrix display thin film circuit as claimed in claim 10, wherein the layer of passivation material includes one of $Ta_2O_5$, $TiO_2$, $V_2O_5$, $Nb_2O_5$, $W_2O_3$, $ZrO_2$, $HfO_2$, $SC_2O_3$, $Y_2O_3$, $La_2O_3$, $Ga_2O_3$, MgO, $SnO_2$, SnO, $Zn_2SnO_4$, $AlCuO_2$, $SrCu_2O_2$, $SrTiO_3$, $BaTiO_3$, $MnTiO_3$, $WO_3$, $MoO_3$, $Mo_2O_3$, PbO, $Bi_2O_3$, $(B_2O_3)_x(Al_2O_3)_y(In_2O_3)_z$ or combinations thereof in stack or in composite forms.

12. The active matrix display thin film circuit as claimed in claim 10, wherein the layer of passivation material is substantially more insulating or less conductive than the metal oxide semiconductor channel and preferably has a conductivity less than $10^{-10}$ S/cm.

13. The active matrix display thin film circuit as claimed in claim 12, wherein more acceptor-like states are formed in the layer of passivation material than in the metal oxide semiconductor channel.

14. The active matrix display thin film circuit as claimed in claim 12, wherein more acceptor-like states are formed in the layer of passivation material than in the layer of gate dielectric.

15. The active matrix display thin film circuit as claimed in claim 12, wherein carriers in the metal oxide semiconductor channel are highly concentrated near an interface with the layer of gate dielectric.

16. The active matrix display thin film circuit as claimed in claim 10, wherein the layer of passivation material covering at least the portion of the metal oxide semiconductor channel between the source/drain contacts is deposited one of:
before metal source/drain contacts are positioned on the metal oxide semiconductor channel, and
after metal source/drain contacts are positioned on the metal oxide semiconductor channel.

17. The active matrix display thin film circuit as claimed in claim 10, wherein the active matrix display thin film circuit is used for an electronic device receiving or generating light.

18. The active matrix display thin film circuit as claimed in claim 17, wherein the electronic device is one of a display device, image array device, bio-sensor device, touch/proximity/gesture sensor device, chemical sensor device or combinations thereof.

19. The active matrix display thin film circuit as claimed in claim 18, wherein the electronic device is one of an active matrix liquid crystal display (AMLCD), an active matrix organic light emitting diode (AMOLED), an active matrix light emitting diode (AMLED), and an active matrix electrophoretic display (AMEPD).

20. The active matrix display thin film circuit as claimed in claim 10, further including a second gate, the second gate being either directly on top of the layer of passivation material, or alternatively the second gate being on top of a second gate dielectric layer overlying the layer of passivation material.

21. In an active matrix display thin film circuit including a plurality of metal oxide thin film transistors, a method of fabricating each metal oxide thin film transistor in the plurality of metal oxide thin film transistors with improved stability and mobility comprising, not necessarily in an order listed, steps of:
providing a substrate and forming a gate with a layer of gate dielectric covering at least a portion of the gate;

depositing a metal oxide semiconductor layer on the layer of gate dielectric opposite the gate, the metal oxide semiconductor layer having a conduction band minimum (CBM) with a first energy level;

positioning spaced apart source and drain contacts on the metal oxide semiconductor layer and on opposite sides of the gate, the spaced apart source and drain contacts defining a channel area in the metal oxide semiconductor layer between the spaced apart source and drain contacts and in substantial alignment with the gate;

selecting a passivation material having a conduction band minimum (CBM) with a second energy level lower than, equal to, or no more than 0.5 eV above the first energy level and the passivation material having an insulating value that is retained and a charge neutrality that is maintained after electron transfer from the metal oxide channel layer; and positioning a layer of the selected passivation material on the channel area the metal oxide semiconductor layer to define an interface between the channel area in the metal oxide semiconductor layer and the layer of the selected passivation material, whereby electrons in the metal oxide semiconductor channel adjacent the interface are free to transfer into the layer of the selected passivation material, the interface maintaining a substantially constant threshold voltage in the presence of optically induced electrons in the metal oxide semiconductor channel.

22. The method as claimed in claim 21, wherein the step of positioning the layer of the selected passivation material includes vacuum deposition methods.

23. The method as claimed in claim 22, wherein the step of positioning the layer of the selected passivation material by vacuum deposition methods includes one of thermal deposition, sputter deposition, chemical vapor deposition and atomic layer deposition.

24. The method as claimed in claim 21, wherein the step of positioning the layer of the selected passivation material includes a coating process or spray pyrolysis, with a precursor solution followed with a post-annealing process.

25. The method as claimed in claim 24, wherein the coating process includes one of: screen printing, spin-coating, slot coating, spray-coating and transfer printing.

26. The method as claimed in claim 24, wherein the post-annealing process is carried out at a temperature in a range of 150-450° C.

27. The method as claimed in claim 24, wherein layer of the selected passivation material formed from the precursor solution is photopatternable.

28. The method as claimed in claim 21, wherein the step of positioning the layer of the selected passivation material includes patterning by one of lithography processes.

29. The method as claimed in claim 21, wherein the step of selecting the passivation material includes selecting a passivation material including one of $Ta_2O_5$, $TiO_2$, $V_2O_5$, $Nb_2O_5$, $W_2O_3$, $ZrO_2$, $HfO_2$, $SC_2O_3$, $Y_2O_3$, $La_2O_3$, $Ga_2O_3$, $MgO$, $SnO_2$, $SnO$, $Zn_2SnO_4$, $AlCuO_2$, $SrCu_2O_2$, $SrTiO_3$, $BaTiO_3$, $MnTiO_3$, $WO_3$, $MoO_3$, $Mo_2O_3$, $PbO$, $Bi_2O_3$, $(B_2O_3)_x(Al_2O_3)_y(In_2O_3)_z$ or combinations thereof in stack or in composite forms.

30. The method as claimed in claim 21, wherein the step of selecting the passivation material includes selecting a passivation material substantially more insulating or less conductive than the metal oxide semiconductor layer and preferably having conductivity less than $10^{-10}$ S/cm.

31. The method as claimed in claim 21, wherein more acceptor-like states are formed in the layer of selected passivation material than in the metal oxide semiconductor.

32. The method as claimed in claim 21, wherein more acceptor-like states are formed in the layer of passivation material than in the layer of gate dielectric.

33. The method as claimed in claim 21, wherein the step of positioning the layer of the selected passivation material is performed one of before the step of positioning the spaced apart source and drain contacts and after the step of positioning the spaced apart source and drain contacts.

34. The method as claimed in claim 21, wherein the steps of depositing a metal oxide semiconductor layer and positioning the layer of selected passivation material are done without vacuum break by means of a deposition tool with multiple deposition chambers or a chain type deposition tool with multiple deposition positions or chambers.

35. The method as claimed in claim 34, wherein the steps of depositing the metal oxide semiconductor layer and positioning the layer of selected passivation material are done without vacuum break, the deposition tool comprises multiple deposition chambers and further including the deposition in each deposition chamber comprising DC sputter, pulsed-DC sputter, AC sputter, RF sputter, ALD, CVD, or reactive thermal deposition.

36. The method as claimed in claim 34, wherein the steps of depositing the metal oxide semiconductor layer and positioning the layer of selected passivation material are done without vacuum break, the deposition tool is a chain type sputter deposition tool with single vacuum chamber with multiple sputter deposition positions for the channel layer and the passivation/etch-stop layer.

37. The active matrix display thin film circuit as claimed in claim 10, further including a low trap density layer positioned between the layer of gate dielectric and the metal oxide semiconductor channel.

38. The method as claimed in claim 21, further including a step of forming a low trap density layer between the layer of gate dielectric and the metal oxide semiconductor layer.

* * * * *